Oct. 30, 1962 A. F. VERKRUISSEN 3,061,793

TRANSISTOR AMPLIFIER

Filed March 13, 1958

INVENTOR
ARIE FERDINAND VERKRUISSEN

BY Frank R. Jifari
AGENT

United States Patent Office 3,061,793
Patented Oct. 30, 1962

3,061,793
TRANSISTOR AMPLIFIER

Arie Ferdinand Verkruissen, Eindhoven, Netherlands, assignor to North American Philips Company, Inc., New York, N.Y., a corporation of Delaware Filed Mar. 13, 1958, Ser. No. 721,258
Claims priority, application Netherlands Mar. 21, 1957
15 Claims. (Cl. 330—27)

The amplification of signals having a direct-current component, for example a sequence of pulses having the same polarity or a predominant polarity, such as television image signals, gives rise to a difficulty in that when using alternating-current input coupling the working point of the amplification element corresponding to the reference level changes in accordance with the waveform of the signal, for example with its repetition frequency, its amplitude and its width of the input pulses to be amplified.

This change is due to the fact that the transformer or the resistance-capacity input coupling employed does not transmit the direct-current component of the input signal.

The reference level corresponds to a given level of the emitted energy. With image transmission this level is used to transmit information; in accordance with the type of television system it determines, for example, the black or white level and hence the brightness corresponding to each particular energy level.

With pulse amplification, provided that the pulses are not amplitude-modulated, peak limitation is usually practiced in order to obtain adequate suppression of the largest part of the energy of any occurring short interference pulses. Under these conditions a shift of the reference level may bring about a reduction of the amplitude of particular output pulses. Consequently, in the cases referred to as examples, it is desirable to keep the reference level substantially constant. With tube arrangements this is achieved by rectification, for example by means of a biased or unbiased diode, which constitutes a short-circuit for all input voltages above or below the reference level.

With transistor amplifiers this solution is not satisfactory, since the input impedance of a transistor with grounded emitter electrode and, to a still greater extent with grounded base electrode, is comparatively low. In this case the short-circuit by means of a diode is not effective, since the pass resistance of the available diodes exceeds the resistance of the emitter-base path of an amplifying transistor or is comparable with this resistance. The insertion of a series-resistor between one of the electrodes of the diode and the control-electrode of the transistor reduces the control-current and hence the sensitivity of the amplifier; consequently, this expedient does not improve the conditions.

The invention has for its object to overcome this difficulty and to provide a transistor amplifier having alternating-current input coupling and a stabilized output reference level.

The transistor amplifier according to the invention has the feature that the base-emitter circuit of the transistor of at least the last amplifier stage includes an impedance, across which a signal voltage obtained from the signal transmission circuit via this transistor produces, by means of a rectifier, a voltage such that the effective bias voltage between the base electrode and the emitter electrode remains substantially constant irrespective of the waveform, the frequency and the amplitude of the signal, so that the output reference potential is also independent of the waveform, the frequency and the amplitude of the signal.

This measure is preferably applied to an amplifying transistor with grounded base electrode, this base electrode being connected to ground via the said impedance, but the invention is not limited to this specific arrangement.

The invention will be described more fully with reference to the drawing, in which.

Figure 1:
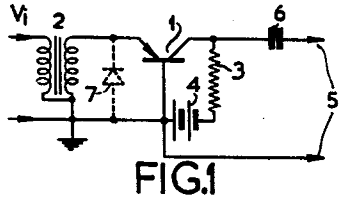
FIG. 1 shows the principal diagram of a conventional transistor amplifier having alternating-current input coupling.

The conventional transistor amplifier shown in FIG. 1 comprises a p-n-p transistor 1 in grounded base connection, which transistor is driven via an input transformer 2 connected between the emitter and the base. The collector circuit of this transistor includes a load resistor 3 and a voltage source 4, which biases the collector electrode of the transistor in the reverse direction via the resistor 3. One end of the primary winding and one end of the secondary winding of the transformer 2 are connected to ground, as well as the base of the transistor 1 and one of the output terminals 5 of the amplifier. The other output terminal is connected to the collector electrode of the transistor by means of a capacitor 6.

Figure 2:
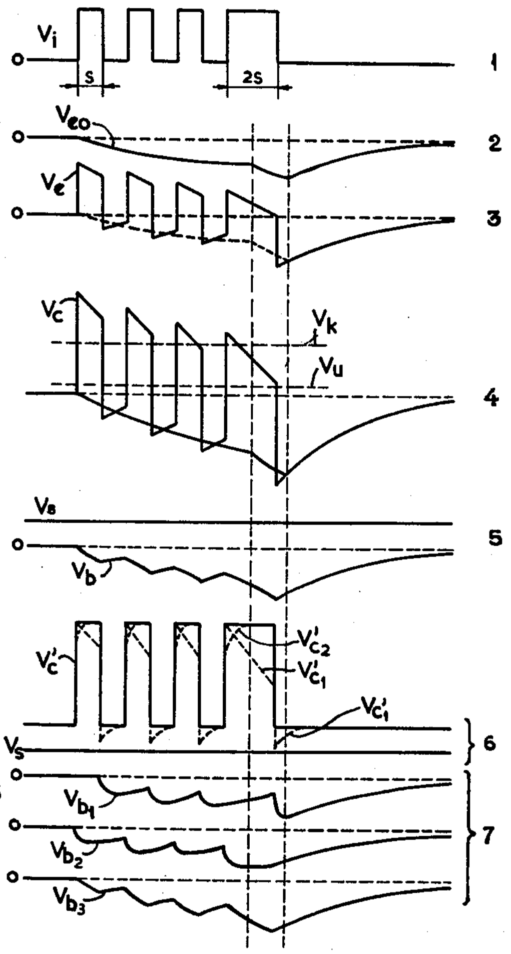
FIG. 2 shows a diagram for explaining the operation of the amplifier according to the invention.

The top line of the diagram of FIG. 2 shows the input voltage $V_i$ across the primary winding of the transformer 2. This input voltage consists of a sequence of positive pulses of given width S and of a last positive pulse of double width 2S. These pulses are transmitted by the transformer 2, as is illustrated on the third line of FIG. 2. The direct-current component $V_{eo}$ of the input signal $V_i$ changes and it can be seen that the value of the input voltage $V_e$ between the emitter and the base of the transistor corresponding to the interval between two successive pulses does not remain constant. With a constant interval between the pulses and with a constant pulse width this reference potential $V_{eo}$ decreases with time, first comparatively strongly and then gradually less, approximately in accordance with an exponential function. The last wide pulse produces a further decrease of the reference potential, which, after the termination of the pulse sequence, increases again slowly up to its initial value, as is illustrated on the second line of FIG. 2.

The output current $I_c$ and the output voltage $V_c$, illustrated on the fourth line of FIG. 2, follow these variations. On this line the output reference level $V_{co}$ corresponding to the input reference level is also illustrated with respect to the voltage level $V_s$ of the source 4. It is evident that the pulses are transmitted with a variable reference level. In order to obtain regular pulses with a constant amplitude and a constant output potential level, the voltage pulses of the fourth line of FIG. 2 would have to be limited by peak limitation to a comparatively low level $V_k$ and, at the same time, a constant output potential level $V_u$ would have to be re-introduced. This is often not desirable, firstly because this involves comparatively complicated arrangements in which the amplitude of the output pulses is strongly reduced and, secondly, because it does not permit the transmission of any information which may have to be transmitted in accordance with the amplitude of the signal.

With tube arrangements, as stated above, the difficulty described is overcome by means of rectification. In this case an unbiased or a reversely biased rectifier is connected between the control electrode of the tube and its cathode. The reference potential of this electrode is thus clamped while the pulses to be transmitted cut off the rectifier, so that they can control the tube. In principle, this measure may also be carried out with a transistor amplifier. However, it is not effective in this case, since the input impedance of the transistor is comparatively low. The input impedance of the transistor 1 of FIG. 1 for example is lower than the pass impedance of a diode 7 (shown in broken lines). Moreover, the input impedance of a transistor in grounded emitter connection is also too low to guarantee a satisfactory operation of the diode 7 for stabilization of the input reference potential. It is, moreover, known that transistors in grounded emitter connection are less suitable than transistors in grounded base connection for the amplification of comparatively high frequencies and of pulses having steep leading and trailing edges and comparatively high repetition frequencies. Consequently, for such uses the arrangement with a grounded base electrode will generally be preferred.

Figure 3:
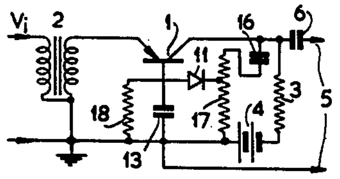
FIGS. 3 to 6 show diagrammatically four different embodiments of the amplifier according to the invention.

The first embodiment of the amplifier according to the invention, shown in FIG. 3, comprises a transistor 1 in grounded base connection driven via an input transformer 2 as is the transistor of the arrangement shown in FIG. 1. The output circuit of this transistor includes, however, in parallel with the lead resistor 3 and the source 4 of reverse bias voltage, a voltage divider consisting of a tapped resistor 17 and a separation capacitor 16. The base electrode of the transistor 1 is connected to ground via a capacitor 13, shunted by a resistor 18 and it is connected to the tapping of the resistor 17 via a rectifier 11. The rectifier 11 is connected in the forward direction for voltages at the tapping which are negative with respect to the base voltage.

Across the lower portion of the resistor 17 are produced voltage pulses which have an amplitude which is proportional to that of the output pulses between the terminals 5. The negative pulses, which correspond to the pulse intervals, are rectified by the rectifier 11 and charge the capacitor 13. By a suitable choice of the ratio between the two portions of the resistor 17, it can be ensured that the variations of the reference potential of the emitter electrode of the transistor are approximately compensated by variations in the same direction of the reference potential of the base electrode of this transistor. The idle output current and the reference potential of the collector of the transistor 1 are thus stabilized and remain subsequently substantially constant, irrespective of the form, the frequency and the amplitude of the signal, for example of the pulses. This approximate compensation is evident from a comparison between the fifth line of FIG. 2, which illustrates the variations in base potential $V_b$ for a complete compensation, and the seventh line of the same figure, which illustrates the variations in base potential $V_{b1}$ of an amplifier as shown in FIG. 3. In the case of complete compensation the amplifier supplies a signal $V_c'$ as illustrated on the sixth line of FIG. 2, whereas in the case of the approximate compensation described an output signal is produced as illustrated on the same line of FIG. 2 and as designated by $V_{c1}'$.

It is evident that the compensation would be improved by a reversal of the polarity of the signal supplied to the rectifier 11. The compensation would then start at the first pulse and not at the first pulse interval and the peaks of the pulses, as well as the variation in signal voltage during the pulse intervals or "bottoms" of the pulse interval, would also be corrected in the correct direction.

Figure 4:
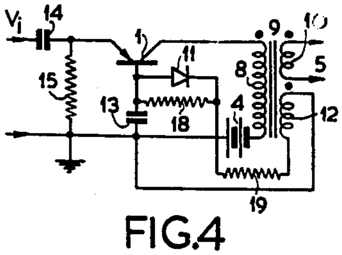

With the second embodiment shown in FIG. 4 this reversal of polarity is produced by means of an output transformer 9. The input circuit of this amplifier includes a coupling capacitor 14 and a leakage resistor 15, connected between the emitter electrode and ground. The output circuit includes the primary winding 8 of the transformer 9, in series with the supply source 4. The transformer 9 has a first secondary winding 10, which is connected to the output terminals 5 and a second secondary winding 12, of which one of the terminals is connected to ground and the other to the cathode of the diode 11.

The number of turns of the winding 12 is chosen to be such that the amplitude of the signal voltage across this winding is equal to or slightly higher than that of the input voltage across the resistor 15. During the positive input pulses the capacitor 13 is rapidly charged via the diode 11 to a negative potential the value of which corresponds with the mean value of the input voltage $V_i$. During the pulse intervals this capacitor is discharged via the resistor 18, which is connected in parallel with the diode 11. If the time constant of the circuit connected between base and ground is equal to that of the input circuit consisting of the capacitor 14 and the resistor 15 in parallel with the input resistance of the transistor 1 measured in the reverse direction, the flat input pulses ($V_i$, first line of FIG. 2) are reproduced without distortion. The peaks of the pulses, however, are slightly distorted due to the rapid charging of the capacitor 13, their leading edges are rounded off, as is illustrated at $V_{c2}'$ on the sixth line of FIG. 2. This may be remedied by connecting a resistor 19 in series with the winding 12. This resistor is to be chosen such that the charging time-constant of the capacitor 13 is equal to the time constant of the input circuit 14, 15, $r_{iv}$, wherein $r_{iv}$ is the input resistance of transistor 1 measured in the forward direction. The resulting compensation voltage $V_{b3}$ is illustrated on the last line of FIG. 2.

By connecting the resistor 18 in parallel with the diode 11, instead of with the capacitor 13, an improvement in linearity of the "discharging segments" of the curve illustrating the variations in base voltage is obtained: then the discharge takes place with a higher time constant, however with a higher voltage difference. Moreover, via the resistors 18 and 19, a certain amount of positive voltage feedback with respect to the lower frequencies is produced. This measure could also be carried out with the embodiment shown in FIG. 3; in this case a negative feedback with respect to the lower frequencies would take place via the resistor 18.

It should be noted that in the case of a resistor-capacitor input coupling as shown in FIG. 4 the time constant of the input circuit $$C_{14}\cdot\frac{R_{15}\cdot r_i}{R_{15}+r_i}$$

is lower during the pulses than during the pulse intervals, so that the conditions for equality between the charging and discharging time constants of the base circuit respectively and the corresponding values of the time constant of the input circuit can be fulfilled:

$$C_{13}\cdot R_{19}=C_{14}\cdot\frac{R_{15}\cdot r_{iv}}{R_{15}+r_{iv}}<C_{14}\cdot\frac{R_{15}\cdot r_{it}}{R_{15}+r_{it}}=C_{13}(R_{19}+R_{18})$$

With a transformer input coupling as shown in FIG. 3 this would not be the case, since the time constant $$\frac{L_{s2}}{r_i}$$

of such an input circuit is higher during the pulses than during the pulse intervals. Herein $L_{s2}$ designates the inductance of the transformer 2, as seen from the emitter-earth circuit of the transistor.

Figure 5:
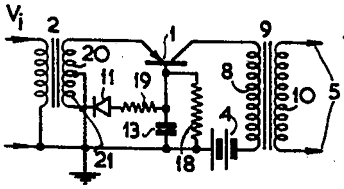

The embodiment shown in FIG. 5 resembles strongly that shown in FIG. 4, with the exception that the compensation voltage is obtained by rectification of the input voltage. The input circuit of this embodiment consists again of an input transformer 2. The secondary winding of this transformer is provided with an earthed tapping, so that an upper portion 20 of this winding serves to drive the transistor 1, whereas the other portion 21 is connected to the series-combination of the diode 11 and of the resistor 19.

The operation of the third embodiment corresponds exactly to that of the amplifier shown in FIG. 4. However, this embodiment includes a kind of forward control, wherein the required ratio between the respective numbers of turns of the portions 20 and 21 of the secondary winding of the transformer 2 is independent of the amplification in the amplifying stage comprising the transistor 1.

The resistor 18 is connected in parallel with the capacitor 13, so that the voltage division produced by the resistors 18 and 19 must be taken into consideration as regards the said ratio. With a suitable choice of this ratio, only the charging and discharging time constants $C_{13}.R_{19}$ and $C_{13}.R_{18}$ respectively must be lower than and approximately equal to the time constants $$\frac{L_{20}}{p_{iv}} \text{ and } \frac{L_{20}}{p_{it}}$$

respectively of the input circuit.

The fourth embodiment shown in FIG. 6 comprises two transistor stages, of which the second is connected as a blocking oscillator, the reference potential of the input electrode being stabilized in the manner described with reference to FIGS. 3, 4 and 5. Owing to this provision the amplifier supplies substantially rectangular pulses, having an amplitude which is substantially independent of the pulse interval.

Figure 6:
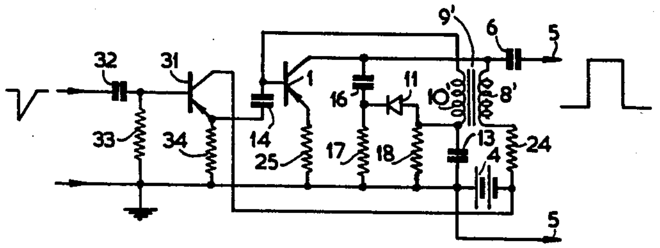

The amplifier shown in FIG. 6 comprises a first stage having a transistor 31 in grounded collector connection, of which the base electrode is coupled to one of the input terminals via a capacitor 32 and to earth and to the second input terminal via a leakage resistor 33. A load resistor 34 is included in the emitter circuit of the transistor 31 and a coupling capacitor 14 is connected between the base electrode of the transistor 1 of the second stage and the emitter electrode of the transistor 31. The emitter circuit of the transistor 1 includes a resistor 25, which facilitates and guarantees the re-blocking of this transistor. The collector circuit of the transistor 1 includes the primary winding 8′ of a transformer 9′ in series with a resistor 24, which produces, by saturation, a limitation of the collector current. In series with the winding 8′ and the resistor 24, a voltage source 4 is connected between earth and the collector electrode of the transistor 1, and the junction of the source 4 and of the resistor 24 is, moreover, directly connected to the collector electrode of the transistor 31. The transformer 9′ is a feed-back transformer and its secondary winding 10′ is connected between the base electrode of the transistor 1 and a capacitor 13. The capacitor 13 is unilaterally connected to earth and shunted by a resistor 18. Via the rectifier 11 it is charged by that portion of the output voltage which occurs across a portion of the resistor 17. The resistor 17 is connected between earth and a capacitor 16, which is on the other hand connected to the collector electrode of the transistor.

In this arrangement a correction of the pulse peaks by reversal of the polarity of the voltage supplied to the rectifier 11 is not necessary. The pulses are formed in the feed-back transformer 9′, so that such a reversal cannot produce an appreciable change in the waveform. The resistor 18 must however, not be connected in parallel with the diode 11, since a negative voltage feed-back is undesirable in a blocking oscillator.

The transistor 1 is normally cut off, since its base is connected to earth via the resistor 18, and it is released by each negative pulse applied to the input terminals of the amplifier. As soon as the transistor 1 is released, a current will flow through the primary winding 8′ of the transformer 9′. Due to the inductance of this winding, this initially weak current increases approximately linearly. The current variation across the winding 8′ induces a voltage at the terminals of the winding 10′ so that the base electrode of the transistor 1 remains biased in the forward direction, even after the termination of the input pulse. The current passing through the winding 8′ thus continues increasing until it has reached the saturation value of the collector current of the transistor 1. This saturation value depends inter alia on the resistors 24 and 25. As soon as it is reached and the current through the winding 8′ can no longer increase, no voltage is any longer induced at the terminals of the winding 10′ so that the potential of the base electrode of the transistor 1 adjusts itself to a reference value determined by the charge of the capacitor 13 via the rectifier 11. The transistor 1 is then again cut off, since its base electrode is, in any case, at most at the same negative potential as the emitter electrode and the current through the collector circuit is abruptly intrrupted.

The idle or reference potential at the capacitor 13 varies with the repetition frequency of the input pulses or with the pulse interval between successive input pulses in a manner such that the amplitude of the output pulses produced remains substantially constant and independent of the pulse interval.

The current pulses passing through the winding 8′ have a leading edge with a steepness determined by the inductance of this winding and by the resistors 24 and 25, and a steep trailing edge. Consequently, these current pulses produce substantially rectangular output voltage pulses.

In the amplifiers described above, the capacitor 13 constitutes a kind of integrating network, together with the rectifier 11 and the internal resistance of the voltage source augmented by the resistor 19, if provided (FIGS. 4 and 5). A corresponding network could consist, for example, of a series inductor L connected between a signal voltage source and the base electrode of the transistor 1 or 1′, this base electrode being then connected to earth via a rectifier and a resistor R, connected in parallel herewith. With such a network the desired charging and discharging time constants would correspond to undesirably high values of the inductance L and/or to undesirably low values of the resistor R and of the internal resistance of the signal-voltage source, whilst low values of the resistor R are not compatible with a satisfactory operation of the rectifier.

The transistor amplifiers described above are pulse amplifiers or pulse shapers (FIG. 6). Except for the amplifier shown in FIG. 6, they may be used for the amplification of any other signal having a direct-current component, for example for the amplification of an image signal in a television system. The operation can be more readily understood with reference to the amplification of a pulse sequence. This operation is equivalent to that of a tube amplifier having a reference potential clamped by means of a rectifier, for example by means of a parallel diode, which step cannot be carried out successfully with a transistor amplifier without taking further steps.

With a series of cascade-connected amplifying stages, it may suffice to stabilize the output reference potential of the last stage in the manner described above.

What is claimed is:

1. A signal amplifier including a transistor having an input electrode system comprising base and emitter electrodes, and an output electrode system comprising a collector electrode, one of said base and emitter electrodes being a common electrode common to said systems, said transistor providing a signal transmission path between a source of input signal voltage applied to said input electrode system and an output circuit connected to said output electrode system, stabilizing means for stabilizing the output reference potential of said amplifier, said stabilizing means comprising an impedance connected between said common electrode and a point of constant potential, deriving means for deriving a portion of said signal voltage from said signal transmission path, and a rectifier element, said rectifier element being connected from said deriving means to the junction point of said impedance and said common electrode, said rectifier being poled in the forward direction with respect to the forward current of said input electrode system, said portion of signal voltage being passed by said rectifier element and producing, across said impedance, a voltage operative to stabilize the effective input electrode system biasing voltage at a substantially constant value, thereby rendering the output reference potential independent of the characteristics of the input signal voltage.

2. A signal amplifier as claimed in claim 1, said deriving means comprising a resistive element and a capacitive element connected in series across said output circuit.

3. A signal amplifier according to claim 1, said deriving means comprising a phase-reversing element operative to reverse the phase of said portion of signal voltage relative to the voltage of said signal transmission path.

4. An amplifier according to claim 3, said impedance comprising a capacitor connected across said deriving means and said rectifier element, said capacitor being charged by said portion of signal voltage, and a resistive element connected across said rectifier element, said resistive element serving as a discharge path for said capacitor.

5. A signal amplifier as claimed in claim 1, said deriving means comprising a transformer having a primary winding connected across said output circuit and a secondary winding coupled therewith, said secondary winding being connected in series with said rectifier element, said secondary winding supplying said portion of signal voltage in reversed phase from the voltage on said signal transmission path.

6. An amplifier according to claim 1, wherein said impedance comprises a capacitor connected across said deriving means and said rectifier element, said capacitor being charged by said portion of signal voltage, and a resistive element connected across said rectifier element, said resistive element serving as a discharge path for said capacitor.

7. A signal amplifier as claimed in claim 1, said deriving means comprising an impedance connected across said input circuit.

8. A signal amplifier comprising a transistor having base, emitter and collector electrodes, said transistor being connected in grounded base connection and providing a signal transmission path between a source of input signal voltage and an output circuit, said source being coupled to said emitter electrode stabilizing means for stabilizing the output reference potential of said amplifier, said stabilizing means comprising an impedance connected between said base electrode and a point at ground potential, deriving means for deriving a portion of said signal voltage from said signal transmission path, and a rectifier element, said rectifier element being connected from said deriving means to the junction point of said impedance and said base electrode, the polarity of said rectifier element being in the forward direction with respect to the forward base-emitter current of said transistor, said portion of signal voltage producing, across said impedance, a rectified voltage operative to stabilize the effective base-emitter voltage at a substantially constant value, thereby rendering the output reference potential independent of the characteristics of the input signal voltage.

9. A signal amplifier as claimed in claim 8, said deriving means comprising a resistive element and a capacitive element connected in series across said output circuit.

10. A signal amplifier according to claim 8, said deriving means comprising a phase-reversing element operative to reverse the phase of said portion of signal voltage relative to the voltage of said signal transmission path.

11. An amplifier according to claim 10, said impedance comprising a capacitor connected across said deriving means and said rectifier element, said capacitor being charged by said portion of signal voltage, and a resistive element connected across said rectifier element, said resistive element serving as a discharge path for said capacitor.

12. A signal amplifier as claimed in claim 8, said deriving means comprising a transformer having a primary winding connected across said output circuit and a secondary winding coupled therewith, said secondary winding being connected in series with said rectifier element, said secondary winding supplying said portion of signal voltage in reversed phase from the voltage on said signal transmission path.

13. An amplifier as claimed in claim 12, said impedance comprising a capacitor connected across said deriving means and said rectifier element, said capacitor being charged by said portion of signal voltage, and a resistive element connected across said rectifier element, said resistive element serving as a discharge path for said capacitor.

14. An amplifier according to claim 8, wherein said impedance comprises a capacitor connected across said deriving means and said rectifier element, said capacitor being charged by said portion of signal voltage, and a resistive element connected across said rectifier element, said resistive element serving as a discharge path for said capacitor.

15. A signal amplifier as claimed in claim 8, said deriving means comprising an impedance connected across said input circuit.

References Cited in the file of this patent

UNITED STATES PATENTS

| | | |
|---|---|---|
| 2,144,995 | Pulvermacher | Jan. 24, 1939 |
| 2,675,423 | Kirkness | Apr. 13, 1954 |
| 2,698,416 | Sherr | Dec. 28, 1954 |
| 2,731,567 | Sziklai et al. | Jan. 17, 1956 |
| 2,844,647 | Hurford | July 22, 1958 |
| 2,860,196 | Schultz | Nov. 11, 1958 |

FOREIGN PATENTS

| | | |
|---|---|---|
| 162,946 | Australia | Aug. 27, 1953 |
| 201,034 | Australia | Feb. 22, 1956 |